United States Patent [19]

Sung et al.

[11] Patent Number: 5,354,382
[45] Date of Patent: Oct. 11, 1994

[54] ELECTRON CYCLOTRON RESONANCE APPARATUS COMPRISING WAFER COOLING PEDESTAL

[75] Inventors: Roh Y. Sung; Chel S. Park; Sang Y. Lee; Cheong D. Lee; Dae H. Kim, all of Ichonkun, Rep. of Korea

[73] Assignee: Hyundai Electronics Industries Co., Ltd., Rep. of Korea

[21] Appl. No.: 192,390

[22] Filed: Feb. 7, 1994

[30] Foreign Application Priority Data

Feb. 6, 1993 [KR] Rep. of Korea ................ 1993-1635

[51] Int. Cl.$^5$ .................. C23C 16/50; H01L 21/00
[52] U.S. Cl. .............. 118/723 MR; 118/725; 118/728; 118/729; 156/345
[58] Field of Search ........... 118/723 MW, 723 ME, 118/723 MR, 723 MA, 724, 725, 728, 729, 733; 156/345

[56] References Cited

U.S. PATENT DOCUMENTS

| | | | |
|---|---|---|---|
| 5,033,538 | 7/1991 | Wagner et al. | 118/728 X |
| 5,078,851 | 1/1992 | Nishihata et al. | 156/345 X |
| 5,228,501 | 7/1993 | Tepman et al. | 118/728 X |
| 5,238,499 | 8/1993 | van de Ven et al. | 156/345 X |

Primary Examiner—Breneman R. Bruce
Assistant Examiner—Jonathan D. Baskin
Attorney, Agent, or Firm—Merchant, Gould, Smith, Edell, Welter & Schmidt

[57] ABSTRACT

An electron cyclotron resonance apparatus for treating a wafer by plasma generated by utilizing a resonance of electrons. The apparatus is constructed to improve a temperature uniformity of a wafer by injecting helium as a heat transfer medium between the wafer and a wafer pedestal on which the wafer is laid and thereby transferring a heat from the wafer to the wafer pedestal. The apparatus is also constructed to move a desired wafer treating position. As a result, it is possible to fabricate semiconductor devices having a superior performance.

12 Claims, 5 Drawing Sheets

ND Field of the Invention

ELECTRON CYCLOTRON RESONANCE APPARATUS COMPRISING WAFER COOLING PEDESTAL

BACKGROUND OF THE INVENTION

1. Field of the Invention

The present invention relates to an apparatus for fabricating semiconductor devices by treating a wafer by use of plasma, and more particularly to an electron cyclotron resonance (ECR) apparatus for treating a wafer by plasma generated by utilizing a resonance of electrons.

2. Description of the Prior Art

Generally, ECR etching equipments are equipments for performing a deposition process and a etching process for wafers by using plasma. They should have a construction capable of cooling wafers in order to inhibit a rise in a wafer temperature due to a high temperature used.

In conventional ECR equipments, a cooling device is equipped in a wafer pedestal on which a wafer is seated, so as to cool a heat transferred to the wafer from the hot plasma and thus prevent the rise of the wafer temperature.

During the etching, the wafer is kept at a room temperature by the cooling device. However, an irregularity in wafer temperature occurs due to a gap defined between the wafer and the wafer pedestal on which the wafer is seated and a temperature irregularity of the wafer pedestal. As a result, an etch characteristic exhibiting on the wafer becomes irregular, resulting in a poor etch characteristic of the wafer.

SUMMARY OF THE INVENTION

Therefore, an object of the invention is to solve the above-mentioned problem encountered in the prior art and to provide an ECR apparatus capable of achieving a uniform temperature of a wafer by use of a heat transfer gas and thereby obtaining a uniform etch characteristic of the wafer, and achieving an easy cooling of the wafer.

In accordance with the present invention, this object can be accomplished by providing an electron cyclotron resonance apparatus comprising: a circular wafer pedestal having a central hole and an O-ring disposed on an upper surface of said wafer pedestal and adapted to support an wafer; a wafer lifter slidably fitted in said central hole of the wafer pedestal and adapted to lift said wafer laid on said O-ring; a longitudinally extending hollow shaft having at an upper end thereof an upward extension adapted to receive a lower portion of said wafer lifter and an axial passage for a heat transfer gas for transferring a heat from the wafer to a refrigerant, said upper end of said hollow shaft defining a gap with a lower end of said wafer lifter; a refrigerant circulating member provided in the wafer pedestal and adapted to absorb said heat transferred to the wafer pedestal by said heat transfer gas; a refrigerant circulating line longitudinally extending in parallel to the hollow shaft, said refrigerant circulating line being adapted to supply the refrigerant to said refrigerant circulating member; a supporting housing surrounding both the hollow shaft and the refrigerant circulating line; a clamp lifter operatively connected to the hollow shaft and provided at an upper end with a plurality of spaced clamps adapted to clamp the wafer laid on the wafer pedestal when said clamp lifter is vertically moved by a vertical movement of the hollow shaft; an outer housing surrounding both the supporting housing and the wafer pedestal and having a chamber for treating the wafer laid on the wafer pedestal by plasma and a vacuum channel for venting said plasma used; and a stepping motor adapted to vertically move the overall system of the apparatus and thus adjust a vertical position of said outer housing.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Referring to FIGS. 1 to 5, there is illustrated an ECR apparatus in accordance with the present invention.

Figure 1:
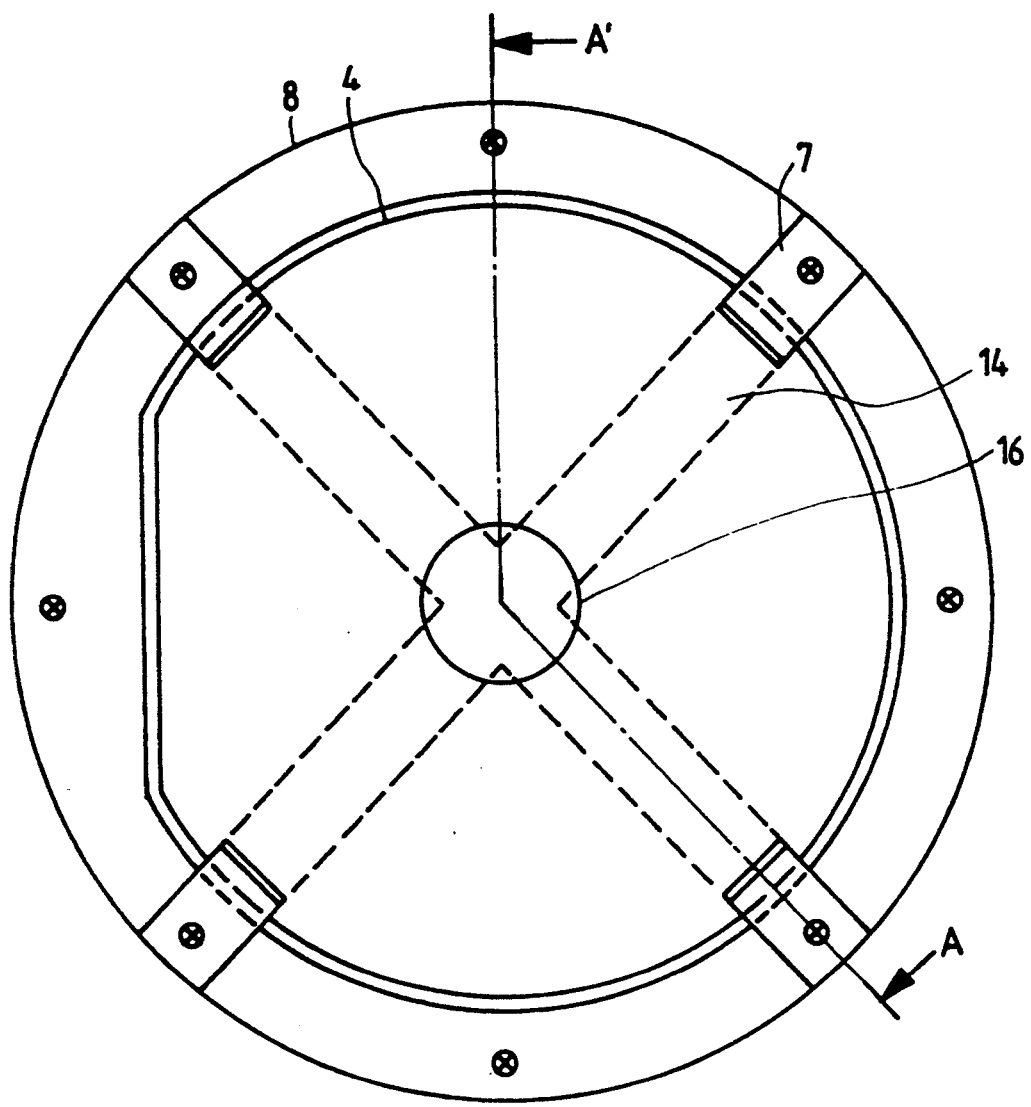
FIG. 1 is a plan view of a wafer pedestal constituting a part of an ECR apparatus in accordance with the present invention.

FIG. 1 is a plan view of the ECR apparatus. As shown in FIG. 1, the ECR apparatus comprises a wafer pedestal 8 on which a wafer 4 to be treated is seated. The ECR apparatus further comprises clamps 7 adapted to hold the wafer 4 at a desired position during the treatment. The ECR electrode further comprises a clamp lifter 14 for vertically moving the clamps 7 to fix the wafer 4 and a wafer lifter 16 for receiving a wafer entering a treating chamber by a robot arm 32 and seating it on the wafer pedestal 8. These elements will be described in detail in conjunction with FIG. 2.

Figure 2:
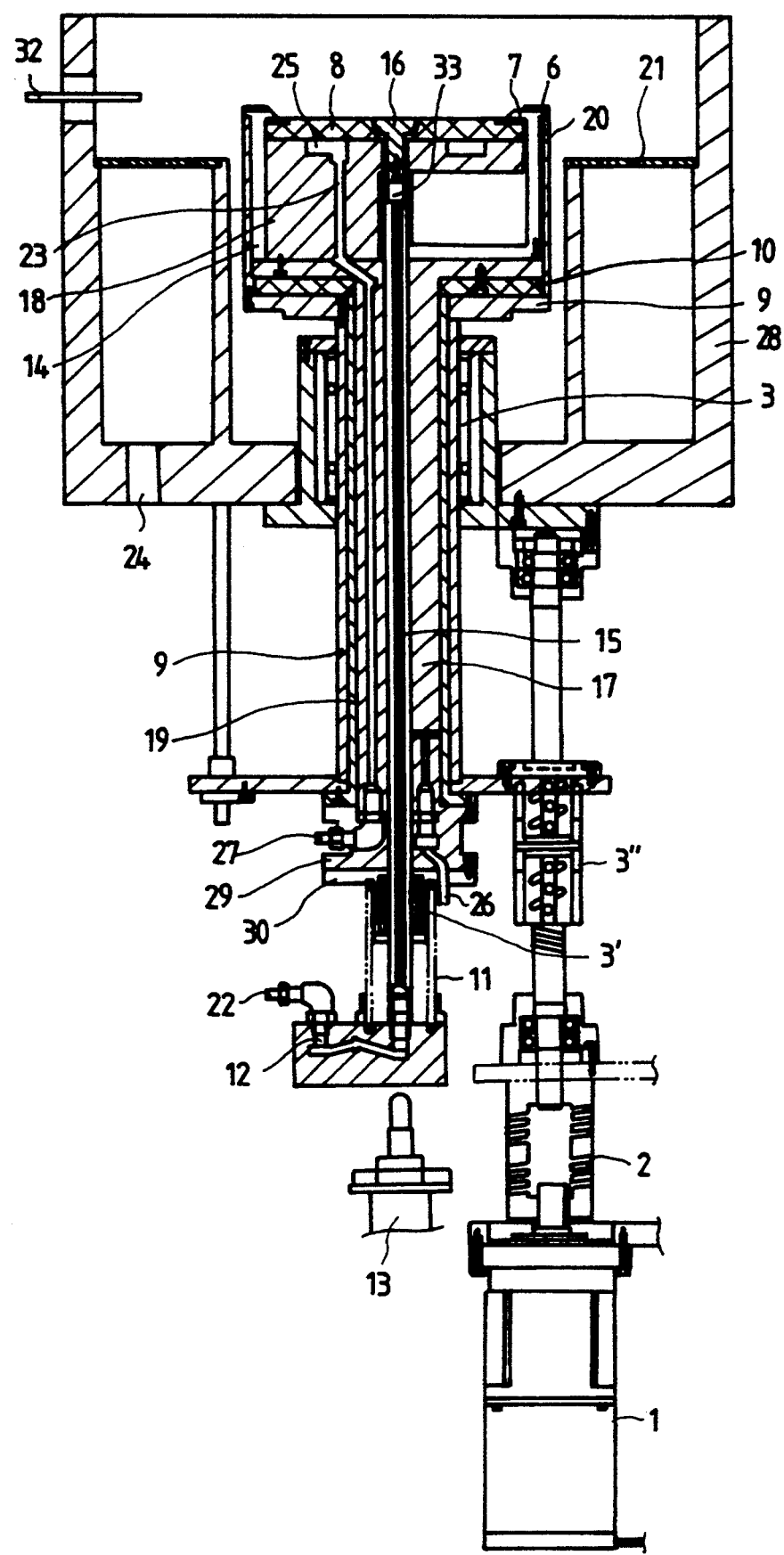
FIG. 2 is a cross-sectional view taken along the line A-A' of FIG. 1, showing the overall construction of the ECR apparatus.

FIG. 2 is a sectional view taken along the line A-A' of FIG. 1. FIG. 2 shows the overall construction of the ECR apparatus which is constructed to improve a temperature uniformity of a wafer by injecting helium as a heat transfer medium between the wafer and the wafer pedestal and thereby transferring a heat from the wafer to the wafer pedestal 8.

The wafer pedestal 8 on which a wafer is seated has a hole having a predetermined dimension. Through the hole of the wafer pedestal 8, the wafer lifter 16 moves vertically. The wafer pedestal 8 is provided at its upper surface with an O-ring 31 (FIG. 5) on which the wafer is laid. A heat transfer gas is introduced toward the upper surface of the wafer. The heat transfer gas should be supplied for reducing the temperature of the wafer because a treating chamber, in which the wafer is treated, is kept at a vacuum state.

For supplying the heat transfer gas such as helium toward the lower surface of the wafer, the ECR apparatus has the following construction.

A hollow shaft 15 coaxially arranged with the wafer lifter 16 is provided for feeding helium through the interior thereof. The hollow shaft 15 has at its upper end an extension for slidably receiving the lower portion of the wafer lifter 16. A gap 33 is defined between the lower end of the wafer lifter 16 received in the extension and the upper end of the hollow shaft 15.

The hollow shaft 15 also has at its lower end a helium pipe supporting member 12 which has a helium inlet 22 for receiving helium from an external helium source not shown. In the interior thereof, the helium pipe supporting member 12 has a helium pipe connected to the hollow shaft 15. The helium pipe is arranged at a predetermined angle so as to prevent any discharge at its portion to which radio frequency is applied.

Beneath the helium pipe supporting member 12, a double-stroke cylinder 13 is disposed to lift the helium pipe supporting member 12 and thus the hollow shaft 15. As the cylinder 13 lifts the helium pipe supporting member 12, the hollow shaft 15 is upwardly moved, so that the wafer lifter 16 can be upwardly moved to receive or lift a wafer after a predetermined time.

To the upper portion of the hollow shaft 15, at least one lifter is fixedly mounted so as to construct the clamp lifter 14 which forms a Y-shape together with the hollow shaft 15. When a wafer is fed to a position where it is disposed above the wafer pedestal 8 by a feeding device, the hollow shaft 15 is upwardly moved by the cylinder 13 having two strokes. By the upward movement of the hollow shaft 15, the clamp lifter 14 is once upwardly moved, thereby causing the clamps 7 to upwardly move. By the lapse of a predetermined time, the wafer lifter 16 is upwardly moved by the upward movement of the hollow shaft 15. This is because the gap is defined between the upper end of the hollow shaft 15 and the lower end of the wafer lifter 16.

In other words, the hollow shaft 15 moves upwardly by a primary stroke of the cylinder 13, so that the clamps 7 are lifted by means of a vertical movement transmitting construction to form a wafer receiving path.

After completion of the above operation, the wafer is fed by a wafer feeding device to a position where it is horizontally positioned in the treating chamber such that its center is aligned with the center of the ECR apparatus. The treating chamber is maintained in vacuum. As the hollow shaft 15 further moves upwardly by a secondary stroke of the cylinder 13, the wafer lifter 16 centrally disposed in the wafer pedestal 8 is lifted to receive the wafer from the wafer feeding device. Thus, the wafer fed from an external source can be seated on the wafer pedestal disposed in the treating chamber. After completion of the treatment, the wafer is taken out of the treating chamber in a manner reverse to the above-mentioned manner.

A cooling water circulating line 23 is disposed adjacent to the hollow shaft 15 to vertically extend in parallel to the hollow shaft 15. The cooling water circulating line 23 is provided at its lower end with a cooling water inlet 27 connected to an external cooling water source not shown. A cooling water circulating member 25 is disposed beneath the wafer pedestal 8 and connected to the upper end of the cooling water circulating line 23. The wafer pedestal 8 has at its lower surface a cooling water circulating line in which a cooling water supplied from the cooling water circulating member 25 is circulated.

The hollow shaft 15 and the cooling water circulating line 23 are surrounded by a T-shaped supporting housing 17 made of aluminum. Between the upper surface of the supporting housing 17 and the wafer pedestal 8, a lifting block 18 is disposed which has a guide passage adapted to guide the movement of the clamp lifter 14. The supporting housing 17 is electrically connected to a radio frequency source not shown. A radio frequency applied to the supporting housing 17 flows along the aluminum of the supporting housing 17 to the wafer pedestal 8. The outer surface of the supporting housing 17 applied with the radio frequency is insulated by insulating members 10 and 19. The insulating member 10 is disposed beneath the upper, horizontal portion of the supporting housing 17 whereas the insulating member 19 is disposed to surround the lower, vertical portion of the supporting housing 17. A vertically extending grounding bar 20 is provided which is in contact with the outer peripheral edge of the wafer pedestal 8.

A pumping line 26 is also provided which is adapted to maintain the treating chamber at a high vacuum state. In other words, the pumping line 26 serves to prevent the treating chamber from being communicated with atmospheric pressure by its pumping function. The pumping line 26 extends vertically between the hollow shaft 15 reciprocating between the atmospheric pressure and the high vacuum treating chamber and the supporting housing 17. At the lower portion of the hollow shaft 15, a supporting plate 29 is mounted which is adapted to partially support the cooling water inlet 27, the pumping line 26 and the hollow shaft 15. To the supporting plate 29, a linear guide unit 30 is coupled which is adapted to guide the linear movement of the hollow shaft 15. A compression coil spring 11 is disposed between the supporting plate 29 and the helium pipe supporting member 12 to vertically extend in parallel to the hollow shaft 15. The compression coil spring 11 serves to prevent the hollow shaft 15 from downwardly moving due to the high vacuum exerted in the treating chamber. The compression coil spring 11 also serves to make the clamps 7 apply a constant pressure to the wafer.

A feeding housing 9 is also provided to surround the insulating members 10 and 19. A chamber housing 28 is mechanically connected to the feeding housing 9. The chamber housing 28 defines the treating chamber for treating the wafer therein and has a vacuum channel 21 and a pumping outlet 24 for discharging plasma used in the treating chamber. By the mechanical connection between the feeding housing 9 and the chamber housing 28, the overall system of the ECR apparatus can be fed to desired positions.

In FIG. 2, the reference numeral 6 denotes a quartz ring for protecting the clamps 7 from plasma, and the reference numerals denote 3, 3' and 3" ball bushes for achieving a smooth operation of the overall feeding system, respectively. The reference numeral 1 denotes a stepping motor for generating a drive power for driving the overall feeding system whereas the reference numeral 2 denotes a coupling housing.

Now, arrangements of the helium line at the upper surface of the wafer pedestal 8 and the cooling water circulating line in the wafer supporting die 8 will be described, in conjunction with FIGS. 3 to 5.

Figure 3:
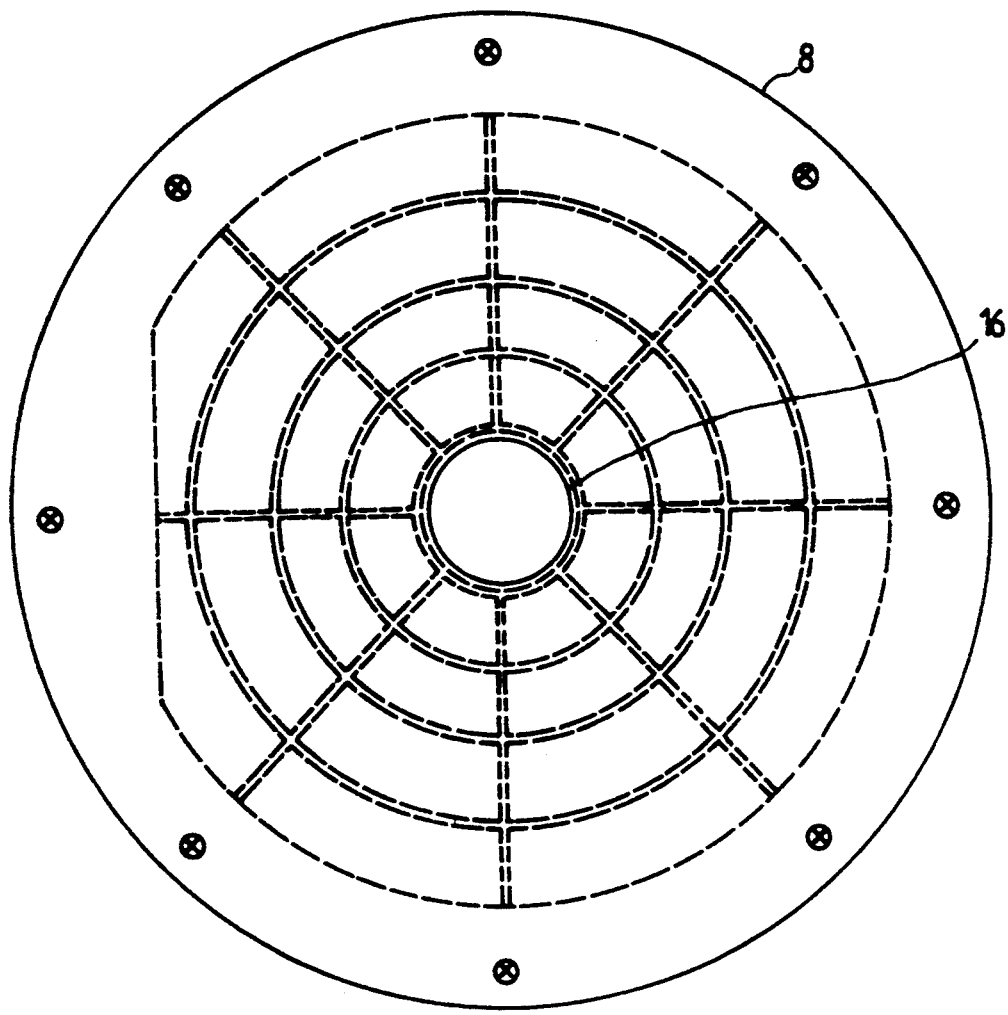
FIG. 3 is a bottom view of the wafer pedestal, showing that helium as a heat transfer gas reaches the lower surface of a wafer through the wafer pedestal.

In FIG. 3, the arrangement of the helium line is shown. As shown in FIG. 3, the arrangement of the helium line is made such that a helium gas is radially spread along the upper surface of the wafer supporting die 8 when the wafer lifter 16 is lifted.

Figure 4:
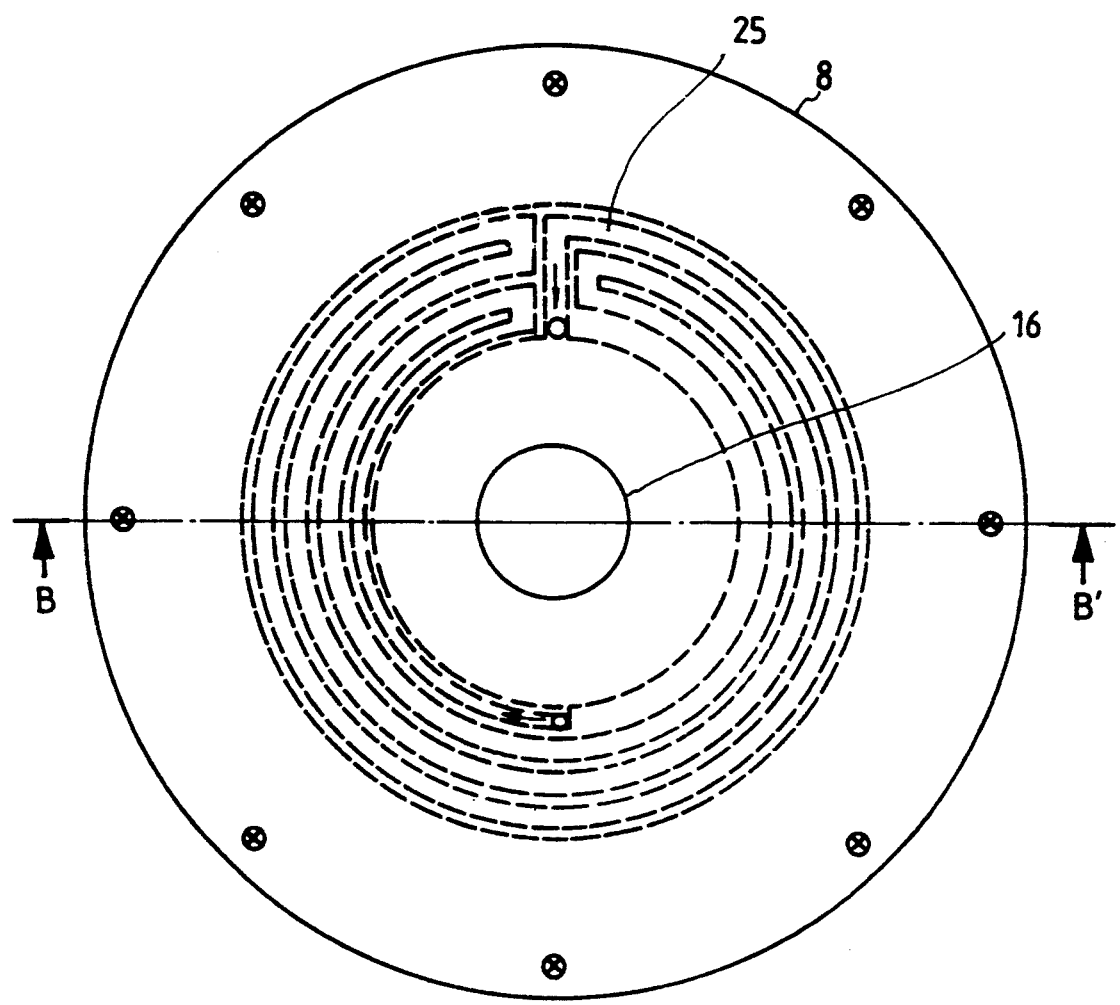
FIG. 4 is a plan view of the wafer pedestal, showing a cooling water circulating line for cooling the wafer pedestal.

In FIG. 4, the arrangement of the cooling water circulating member 25 is shown. By the cooling water circulating member 25, a cooling water is circulated in the wafer pedestal 8. By virtue of such a circulation of the cooling water, it is possible to prevent a phenomenon that photoresists formed on the wafer are burned due to an increase in temperature of the wafer caused by a heat transferred from plasma to the wafer during an etching of the wafer.

Figure 5:
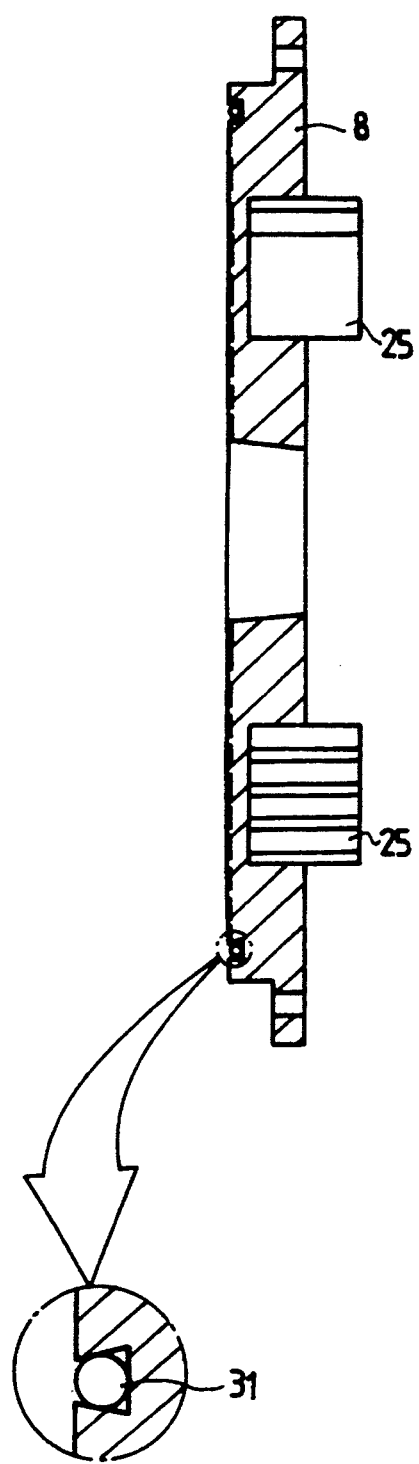
FIG. 5 is a cross-sectional view taken along the line B-B' of FIG. 4.

As shown in FIG. 5 which is a cross-sectional view taken along the line B-B' of FIG. 4, the wafer is seated on the O-ring 31 disposed on the upper surface of the wafer pedestal 8 such that it does not come into contact with the wafer pedestal 8. To this end, the wafer pedestal 8 has a radius of curvature ρ of 7,300 to 7,500 mm so as to reduce the space defined between the wafer pedestal 8 and the wafer as much as possible. Although not shown, the wafer pedestal 8 has at its upper surface grooves for forming a uniform stream of plasma.

With the above-mentioned construction, helium can be injected between the wafer and the wafer pedestal 8. The injected helium transfers a heat from the wafer to the wafer pedestal 8. The transferred heat to the wafer pedestal 8 is absorbed in the cooling water circulating in the wafer pedestal 8, thereby causing the wafer pedestal 8 to be cooled.

As apparent from the above description, the ECR apparatus of the present invention can achieve the uniformity in temperature by using helium and thereby eliminate a difference in etch characteristic. Also, the ECR apparatus can feed the overall construction thereof to desired positions. As a result, it is possible to fabricate semiconductor devices having a superior performance.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An electron cyclotron resonance apparatus comprising:
   a circular wafer pedestal having a central hole and an O-ring disposed on an upper surface of said wafer pedestal and adapted to support a wafer;
   a wafer lifter slidably fitted in said central hole of the wafer pedestal and adapted to lift said wafer laid on said O-ring;
   a longitudinally extending hollow shaft having at an upper end thereof an upward extension adapted to receive a lower portion of said wafer lifter and having an axial passage for a heat transfer gas for transferring heat from the wafer to a refrigerant, said upper end of said hollow shaft defining a gap with a lower end of said wafer lifter;
   a refrigerant circulating member provided in the wafer pedestal and adapted to absorb said heat transferred to the wafer pedestal by said heat transfer gas;
   a refrigerant circulating line longitudinally extending in parallel to the hollow shaft, said refrigerant circulating line being adapted to supply the refrigerant to said refrigerant circulating member;
   a supporting housing surrounding both the hollow shaft and the refrigerant circulating line;
   a clamp lifter operatively connected to the hollow shaft and provided at an upper end with a plurality of spaced clamps adapted to clamp the wafer laid on the wafer pedestal when said clamp lifter is vertically moved by a vertical movement of the hollow shaft;
   an outer housing surrounding both the supporting housing and the wafer pedestal and having a chamber for treating the wafer laid on the wafer pedestal by plasma and a vacuum channel for venting said plasma used; and
   a stepping motor adapted to adjust a vertical position of said outer housing.

2. An electron cyclotron resonance apparatus in accordance with claim 1, wherein said hollow shaft is integral with said clamp lifter such that the clamp lifter moves vertically by said vertical movement of the hollow shaft, thereby causing said clamps to clamp said wafer laid on said wafer pedestal.

3. An electron cyclotron resonance apparatus in accordance with claim 1, wherein said wafer pedestal has a radius of curvature for minimizing a space defined between the wafer pedestal and the wafer.

4. An electron cyclotron resonance apparatus in accordance with claim 3, wherein said radius of curvature of said wafer pedestal is 7,300 to 7,500 mm.

5. An electron cyclotron resonance apparatus in accordance with claim 1, wherein each of said clamps is covered with a quartz ring adapted to prevent the clamp from being damaged by said plasma.

6. An electron cyclotron resonance apparatus in accordance with claim 1, wherein said wafer pedestal has grooves formed on an upper surface thereof and adapted to form a uniform stream of plasma.

7. An electron cyclotron resonance apparatus in accordance with claim 1, further comprising a pumping line adapted to maintain the treating chamber at high vacuum, the pumping line extending vertically between the hollow shaft and the supporting housing.

8. An electron cyclotron resonance apparatus in accordance with claim 1, further comprising a lifting block surrounding said hollow shaft and said refrigerant circulating line and having a passage for allowing a movement of said clamp lifter.

9. An electron cyclotron resonance apparatus in accordance with claim 1, further comprising a double-stroke cylinder for vertically moving said hollow shaft.

10. An electron cyclotron resonance apparatus in accordance with claim 1, further comprising a heat transfer gas pipe in communication with said axial passage of said hollow shaft and connected with the hollow shaft at an angle for avoiding a discharge at a portion of said heat transfer gas pipe to which radio frequency is applied, and a gas pipe supporting member adapted to support a connection area between the heat transfer gas pipe and the hollow shaft.

11. An electron cyclotron resonance apparatus in accordance with claim 10, further comprising a spring adapted to downwardly urge said hollow shaft lifted toward said treating chamber maintained at a high vacuum such that said clamps apply a pressure to said wafer laid on said wafer pedestal.

12. An electron cyclotron resonance apparatus in accordance with claim 11, wherein said spring is disposed at a position where it can apply its resilience to said gas pipe supporting member.

* * * * *